(12) United States Patent
Umehara et al.

(10) Patent No.: US 6,268,644 B1
(45) Date of Patent: Jul. 31, 2001

(54) SEMICONDUCTOR DEVICE

(75) Inventors: Norito Umehara, Ibaraki; Takahiro Imura, Tsukuba; Yoshikatsu Umeda, Beppu, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/366,378

(22) Filed: Aug. 3, 1999

(30) Foreign Application Priority Data

Aug. 4, 1998 (JP) .................................................. 10-220056

(51) Int. Cl.[7] .................................................. H01L 23/495
(52) U.S. Cl. ............................................. 257/667; 257/787
(58) Field of Search .................................... 257/667, 670, 257/787

(56) References Cited

U.S. PATENT DOCUMENTS

| 5,252,783 | 10/1993 | Baird . | |
|---|---|---|---|
| 5,304,841 | 4/1994 | Negoro | 257/667 |
| 5,517,056 | 5/1996 | Bigler et al. | 257/666 |
| 5,596,225 | 1/1997 | Mathew et al. | 257/667 |
| 5,708,294 | 1/1998 | Toriyama | 257/676 |
| 5,723,899 | 3/1998 | Shin | 257/666 |
| 5,812,381 | 9/1998 | Shigeta et al. | 361/813 |
| 5,982,625 | 11/1999 | Chen et al. | 361/748 |
| 5,986,333 | 11/1999 | Nakamura | 257/667 |
| 6,093,959 | 7/2000 | Hong et al. | 257/692 |

*Primary Examiner*—Ngân V. Ngô
(74) *Attorney, Agent, or Firm*—William B. Kempler; Frederick J. Telecky, Jr.

(57) ABSTRACT

To prevent the contact of adjacent wires when a molding resin for forming the external shape of a semiconductor package is poured. The semiconductor device of the present invention is equipped with a semiconductor chip 13 that has a row of electrode pads 13*a* along the periphery of the principal plane, wires 14 that extend from each of the electrode pads 13*a*, a molding resin package material 15 that covers at least the above-mentioned semiconductor chip 13 and the wires 14 and that forms the external shape of the semiconductor device, and dam members that are arranged between the two closest of the above-mentioned wires 14*a* and 14*b*, which are arranged so that the corners of the above-mentioned semiconductor chip are inserted in between the wires, that is, the dummy wires 17.

10 Claims, 5 Drawing Sheets

SEMICONDUCTOR DEVICE

FIELD OF THE INVENTION

The present invention pertains to a resin-sealed semiconductor device, specifically, a semiconductor device that is equipped with a semiconductor chip, a lead that provides an exterior electrical connection to said device, and a fine wire for the electrical connection of these two members and is suitable in particular for preventing short circuits between wires when a mold resin is poured.

BACKGROUND OF THE INVENTION

In semiconductor manufacture technologies, a widely known method for electrically connecting a semiconductor chip to a conductor pattern (referred to below as a conductor lead) in which a semiconductor chip is formed on a lead frame or an insulating substrate, is a method using super fine wire bonding (including the thermocompression bonding method, the ultrasonic method, the thermosonic method in which the above-mentioned two methods are combined, etc.). During wire bonding, one end of gold (Au) and other super fine wires are bonded to electrode pads on the circuit forming surface of a semiconductor chip by a capillary tool and looped, that is, arranged so that they form loops. The other ends are bonded to the conductor leads.

One advantage of wire bonding is that mutual shrinkage between internal members of a semiconductor device due to heat is absorbed by the flexibility of the wires, so that high connection reliability is obtained. On the other hand, the flexibility of the wires is disadvantageous because short circuits between the wires can be generated when a molding resin is poured. Along with the demand for miniaturization and high performance of semiconductor devices, the number of wires per unit area has increased, and the short circuit problem between the wires becomes more serious when the molding resin is poured.

FIG. 9 is a conceptual diagram showing a resin flow in a mold 30 based on a transfer molding method. A melted molding resin is poured into a cavity 34 for forming semiconductor devices 10 and 20 shown in FIGS. 1 and 6 from a gate 31 arranged at the corner. The molding resin flows from the corner where the gate 31 is arranged into the cavity 34 and toward the corner 35 that is diagonally opposite the gate. Here, since wires 32 extend radially from the electrode pads arranged around the semiconductor chip 33 in all directions, some wires, that is, the wires in the corners 34' in the cavity 34 on both sides of the gate receive the flow of the molding resin from an approximately perpendicular direction.

FIGS. 10 and 11 are enlarged diagrams showing one of the two side corners 34' in the cavity that receive a flow of molding resin that is approximately perpendicular to the wires 32 when the resin is poured from position A in FIG. 9, that is, the above-mentioned gate 31. The two figures show the condition before and after the molding resin is poured. As shown in the figure, a conventional semiconductor device has the area 34 at the corner of the semiconductor chip 33, where there is no electrode pad 33a. After a semiconductor device has been sealed with a molding resin, mechanical stresses are generated in a region with a size of about 200–400 μm in the corner (33') of semiconductor chip (33), and cracks are generated in the silicon that is used as the substrate for the semiconductor chip 33 or connection defects are generated in the wire 32, so that the reliability is lowered. For this reason, this design is disadvantageous for I/O buffer circuits, antistatic circuits (ESD circuits), electrode pads, etc. Therefore, as shown in the figure, the gap between the two closest wires 32a and 32b in the corner (33') of the semiconductor chip is wider than the gap between the other wires.

As shown in FIG. 11, the arrow shows the direction of the flow of the molding resin poured from gate 31, in the two corners 34', which are toward the sides with respect to the gate position of the cavity 34, and the flow is approximately perpendicular to the direction of the wires 32. The wires 32 resist the flow of the molding resin but the gap between the wires 32a and 32b in the two side corners in the cavity 34 is widened as mentioned above, so that the resistance is decreased, thereby accelerating the flow. For this reason, the wire 32b, which is downstream of this gap, receives a larger force and is largely deformed, so that the risk of short circuits with adjacent wires is increased.

Therefore, the purpose of the present invention is to prevent wires at the corner of a semiconductor chip from contacting adjacent wires due to the flow of a molding resin, that is, to prevent the short circuit of wires. Another purpose of the present invention is to prevent the short circuit of the above-mentioned adjacent wires with little change to the structure and the manufacturing processes of a semiconductor device.

SUMMARY OF THE INVENTION

The present invention pertains to a semiconductor device that contains wires and is sealed with a molding resin. The semiconductor device of the present invention is equipped with a semiconductor chip that has a row of electrode pads along the periphery of the principal plane, wires that extend from each above-mentioned electrode pad, a molding resin package material that covers at least the above-mentioned semiconductor chip and the above-mentioned wires and that forms the external shape of the semiconductor device, and dam members that are arranged between the two closest of the above-mentioned wires, which are arranged so that the corners of the above-mentioned semiconductor chip are in between the wires.

The flow of the molding resin in the corner of the semiconductor chip is suppressed by the above-mentioned dam members, and the deformation of wires downstream of the dams is decreased. As a result, short circuits between adjacent wires are avoided.

Here, the above-mentioned dam members may also be arranged between the wires in all the corners of the semiconductor chip; however, it is sufficient to position the dams in the corners adjacent to the corner of the above-mentioned semiconductor chip that is closest to a pouring gate when the molding resin is poured.

The above-mentioned dam members generate resistance against the flow of the molding resin, and various kinds of members can be fixed to the semiconductor chip, to the substrate on which said chip is mounted, and various parts can be used. However, an ideal embodiment of the dam members is to use at least one wire that is not electrically operated or used for electric conduction (referred to below as a dummy wire). Since the dummy wire can be bonded with other wires in a wire-bonding process, it is very advantageous in terms of manufacture.

One end of the above-mentioned dummy wire can be fixed to the electrode pad that is formed in the corner of the above-mentioned semiconductor chip and is not electrically operated.

Also, in case the semiconductor chip is arranged on a die pad, the above-mentioned dummy wire may also be fixed to the die pad. Also, the above-mentioned dummy wire may also be fixed to a die pad support pin.

Also, the second end of the above-mentioned dummy wire is preferably fixed near the point where the second end of the other wires is fixed.

Figure 1:
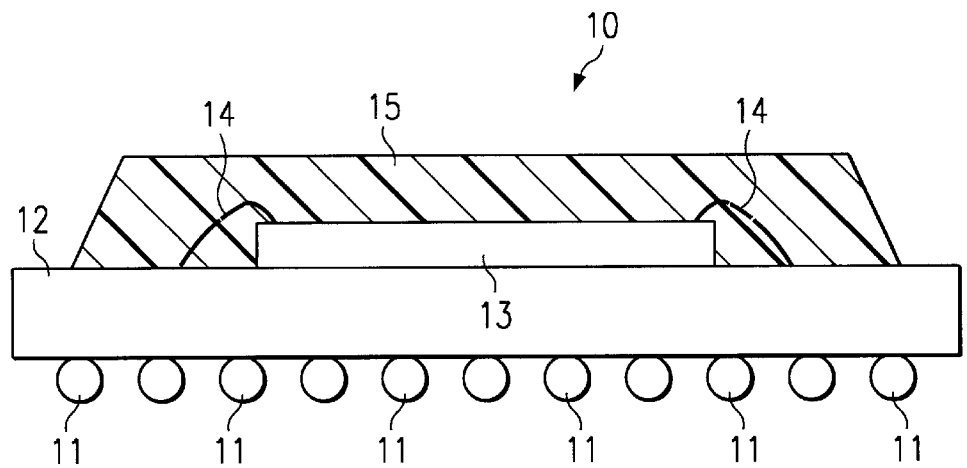
FIG. 1 is a cross section showing the semiconductor device of a BGA type package to which the present invention is applied.

REFERENCE NUMERALS AND SYMBOLS AS SHOWN IN THE DRAWINGS 10, 20 . . . Semiconductor devices; 11 . . . Solder ball; 12 . . . Insulating substrate; 12a, 15 . . . Stitch pads; 13 . . . Semiconductor chip; 13a . . . Electrode pad; 13', 33' . . . Semiconductor chip corners; 14 . . . Wire; 15 . . . Molding resin; 16 . . . Dummy electrode pad; 17 . . . Dummy wire; 18 . . . Dummy stitch pad; 19 . . . Dummy bonding pad; 21 . . . Lead; 30 . . . Mold; 34 . . . Cavity; 34' . . . Two corners to the side of a gate in the cavity; 35 . . . Corner diagonally opposite a gate in the cavity

DESCRIPTION OF THE EMBODIMENTS

Next, the embodiments of the present invention are explained with reference to the figures. FIG. 1 shows the semiconductor device of a BGA (Ball Grid Array) type package to which the present invention is applied. In a semiconductor device 10 of the BGA type package, solder balls 11, which are used as terminals for a printed-circuit board, are two-dimensionally arranged on the lower surface of an insulating substrate 12. On the upper surface of the insulating substrate 12, conductor patterns are formed that connect to the solder balls 11 and are not shown in the figure. A semiconductor chip 13 is fixed onto the insulating substrate 12 and connected to the above-mentioned conductor patterns by wires 14 by means of wire bonding. The semiconductor chip 13 and the wires 14 are provided on the insulating substrate 12 and completely covered with a molding resin package material 15 in order to form the external shape of the semiconductor device 10.

Figure 2:
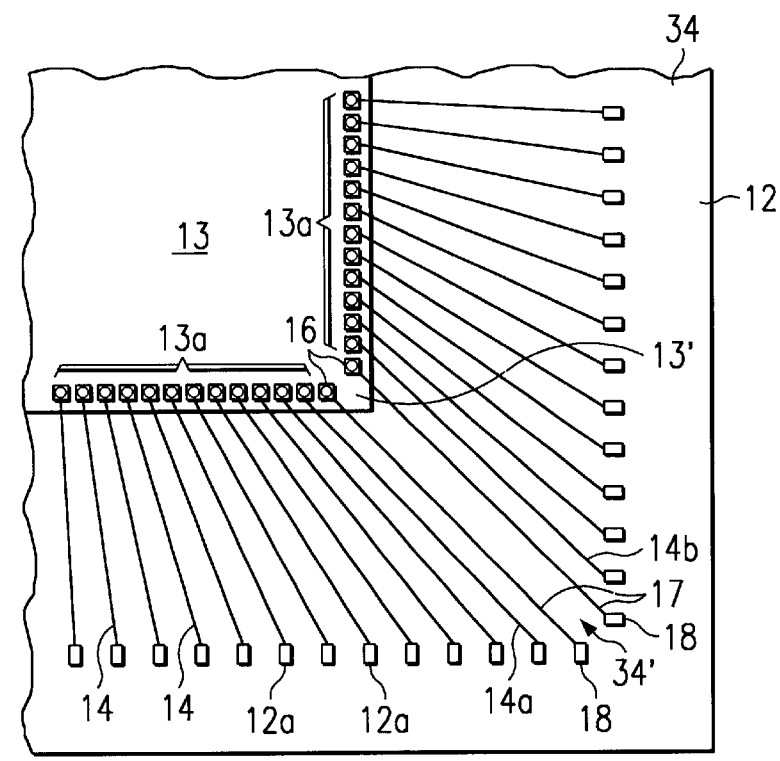
FIG. 2 is an enlarged plan view showing the main parts of FIG. 1 showing a first embodiment of the present invention.

FIG. 2 shows a first embodiment of the present invention in which the dummy wires of the present invention are arranged in the above-mentioned BGA type package. In the figure, part of the semiconductor device 13 of FIG. 1 is shown in a planar configuration in a state in which the package material is removed. On the principal plane of the semiconductor chip 13, that is, on the surface on which circuit elements are formed, electrode pads 13a are formed along its periphery. Wires 14 for achieving electric connection of the semiconductor chip 13 and the conductor patterns on the insulating substrate 12 extend from each electrode pad 13a, form a prescribed loop, and are bonded to stitch pads 12a for the conductor patterns on the insulating substrate 12, (in the figure, the conductor patterns are omitted, and only the stitch pads 12a are shown).

As shown in the figure, each row of the above-mentioned electrode pads 13a along the side of the semiconductor chip 13 ends so that an area of 200–400 μm is left in the corner 13' of the chip. There are dummy electrode pads 16, which are not electrically operated at each end of the row. The dummy electrode pads 16 are required to bond one end of the dummy wires 17 of the present invention onto the principal plane of the semiconductor chip 13. The dummy electrode pads 16 can be formed at the same time as the other electrode pads 13a during the manufacturing processes of the semiconductor chip.

Also, dummy stitch pads 18, which are not electrically operated, are formed on the insulating substrate 12 in order to bond the other ends of the dummy wires 17. In this application example, the dummy stitch pads 18 are unique areas that are located radially on the insulating substrate 12. The dummy stitch pads 18 are positioned alongside the stitch pads 12a of the conductor patterns. The dummy stitch pads 18 can be formed during the process to form the conductor patterns on the insulating substrate 12.

The dummy wires 17 are very fine wires that are composed of gold (Au) or some other metal similar to that of the other wires 14. In actuality, the dummy wires 17 are also bonded during the bonding process of the other wires 14. Since the bonding points of the dummy wires 17, that is, the dummy electrode pads 16 and the dummy stitch pads 18 are parallel with the other electrode pads 13a or stitch pads 12a of the conductor patterns, the dummy wires 17 can be positioned at these bonding points by means of the same looping during the process for bonding the wires 14. Between the wires that are the nearest to corner of the semiconductor chip 13, that is, between the wires 14a and 14b, there is a gap equal to the pitch or more between the other wires, and the dummy wires 17 are arranged to fill the gap.

Figure 3:
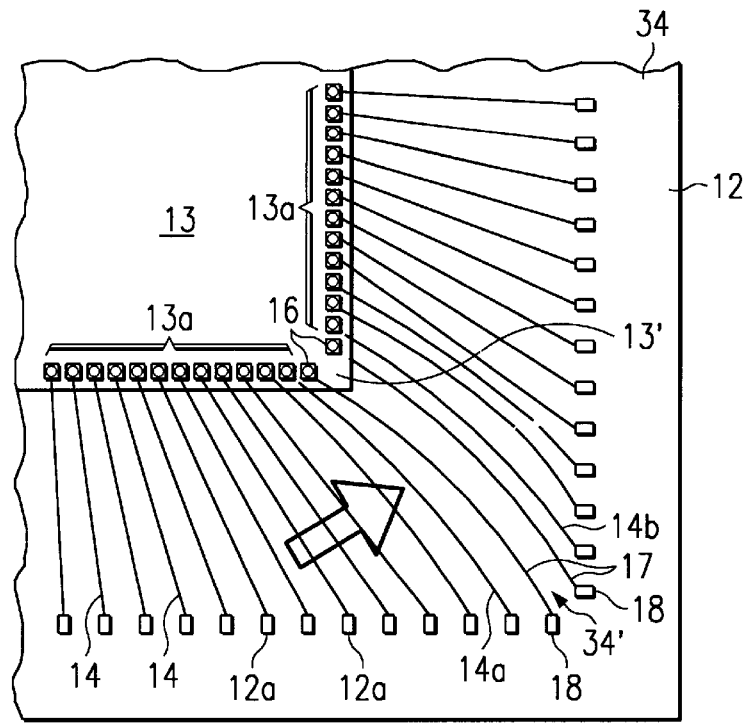
FIG. 3 is an illustrative diagram showing the influence of the flow of a molding resin on wires.
Figure 11:
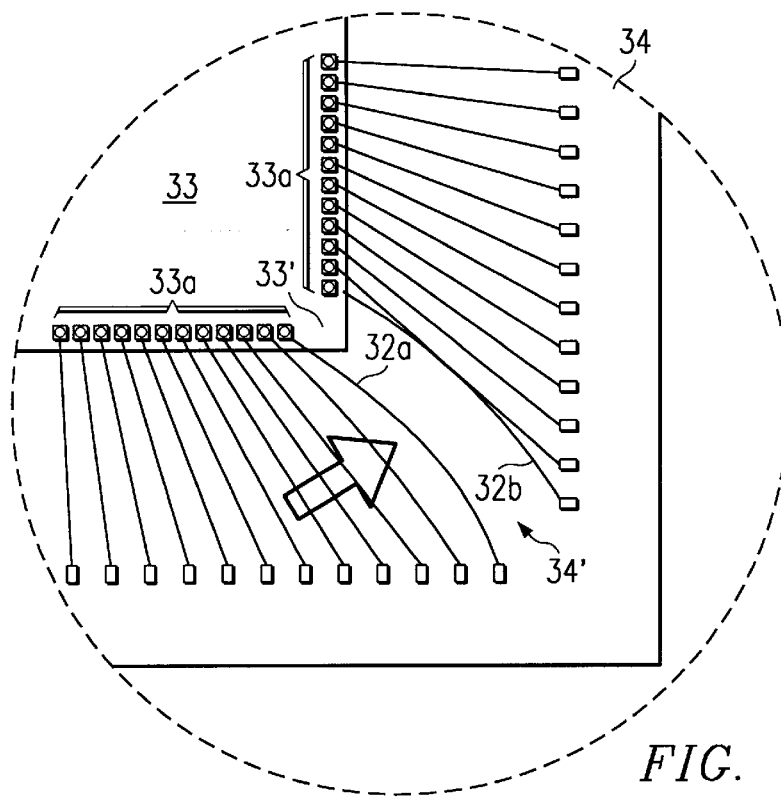
FIG. 11 is an enlarged diagram showing section A of FIG. 9 and shows a state after pouring of a molding resin in a semiconductor device with a conventional structure.

FIG. 3 shows the influence of the flow of a molding resin on wires during the molding process. Near the two side corners 34' in cavity 34, the flow of the molding resin, which is shown by the arrowhead, is approximately perpendicular to the direction of the wires 14. Thus, each wire 14 receives force from the flow and is bent downstream. As explained above, since there is a gap between the wires in the corners of the semiconductor chip, the flow of the molding resin in the conventional structure is accelerated. As a result, the wires downstream of this gap receive a larger force and are bent more (FIG. 11). However, in the example of the present invention shown in FIG. 3, the above-mentioned dummy wires 17 suppress the flow velocity of the molding resin and minimize the influence on the downstream side of the dummy wires.

Figure 4:
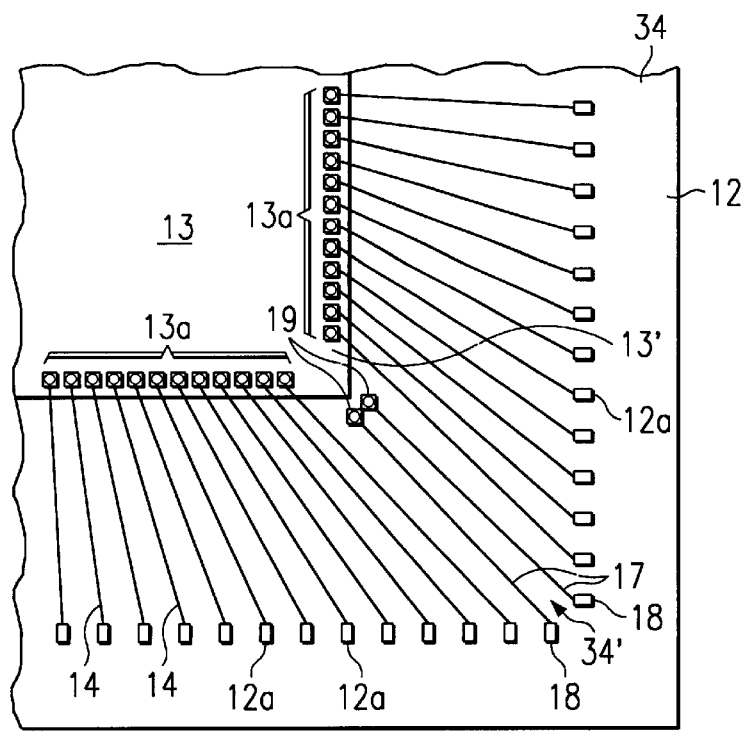
FIG. 4 is an enlarged plan view showing the main parts of FIG. 1 showing a second embodiment of the present invention.
Figure 5:
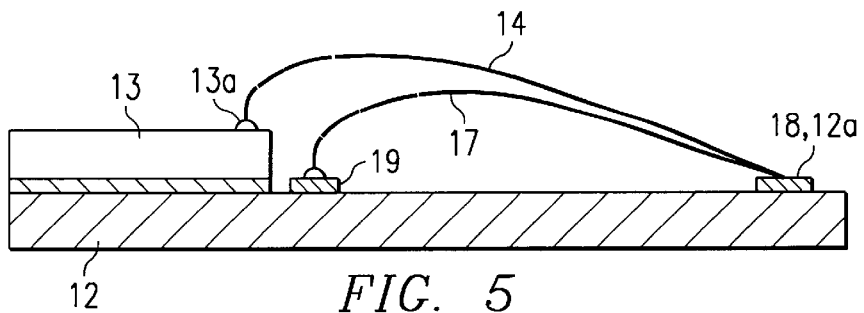
FIG. 5 is a side view of FIG. 4.

FIGS. 4 and 5 show a second embodiment of the present invention in which the dummy wires of the present invention are arranged in the BGA type package. The same symbols that were used for FIG. 2 are used for each constitutional part in the figure unless otherwise specified. In this embodiment, both ends of each dummy wire 17 are bonded to the dummy stitch pads 18 and dummy bonding pads 19. The dummy bonding pads 19, which are near the corner 13' of the semiconductor chip 13, are unique areas located radially on the insulating substrate 12 that are formed at the same time as the conductor patterns. Compared with the previous first embodiment, in this embodiment, one end of the dummy wires 17 must be bonded to the stitches 19, so that a movement different from the movement during the bonding of the other wires 14 must be carried out by the capillary tool. On the other hand, in this embodiment, it is not necessary to form the dummy electrode pads during the manufacturing processes of the semiconductor chip, which is more advantageous than the previous embodiment. In order to reduce the influence of the flow of the molding resin on the wires downstream of the corners of the semiconductor chip 13 as far as possible, as small a difference in the loop height of the wires 14 and the dummy wires 17 is preferable.

Figure 6:
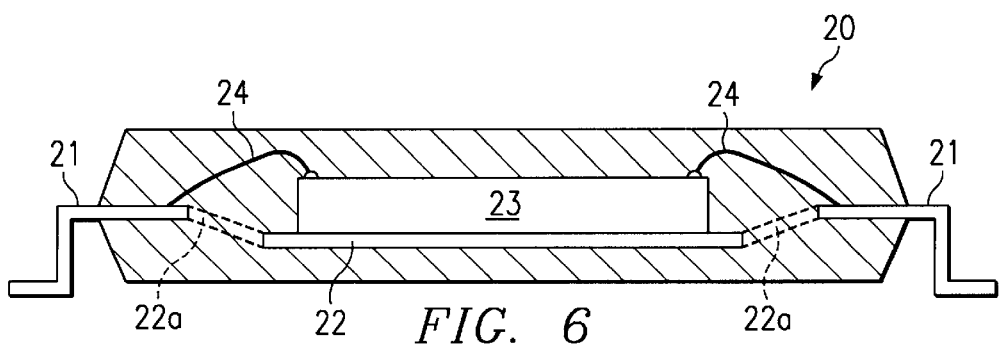
FIG. 6 is a cross section showing the semiconductor device of a TQFP type package using a lead frame to which the present invention is applied.

FIG. 6 shows a semiconductor device 20 of a TQFP (Thin Quad Flat Package) type package using a lead frame to which the present invention is applied. Said semiconductor device 20 is equipped with leads 21 as connecting terminals of the lead frame and a die pad 22 offset below the plane on which several leads 21 are formed. The die pad 22 supports a semiconductor chip 23 before it is sealed with molding resin and the pad has support pins 22a that extend out from its four corners. The support pins 22a extend beyond the package before it is sealed with the molding resin and are cut along the outer edge of the package in a trimming process for cutting the frame of the leads 21. The semiconductor chip 23 is electrically connected to each lead 21 by wires 24.

Figure 7:
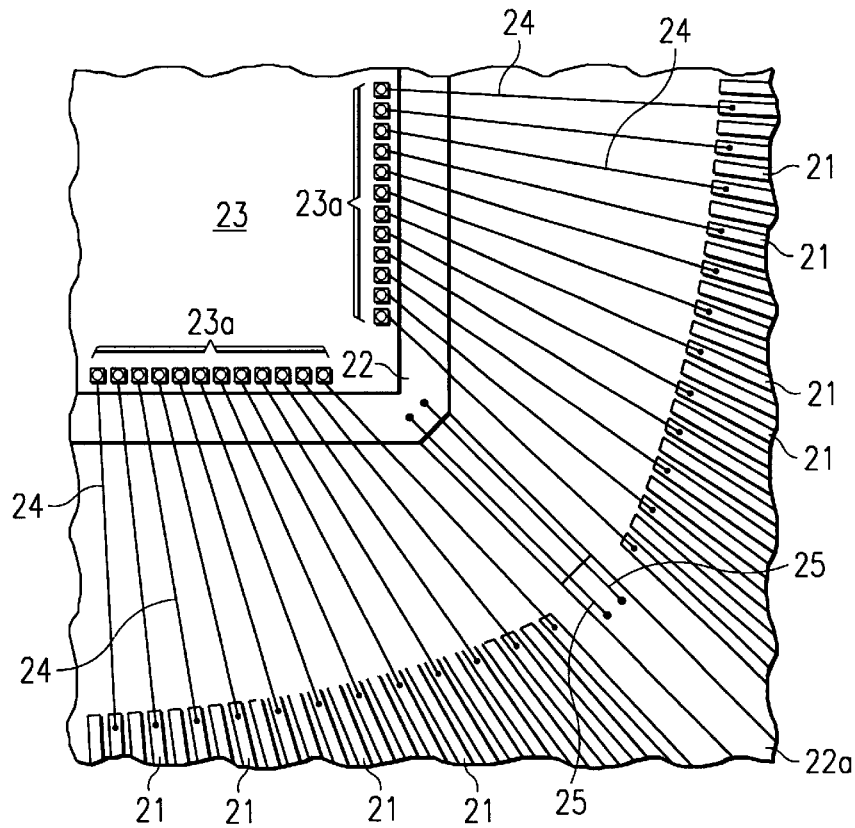
FIG. 7 is an enlarged plan view showing the main parts of FIG. 6 showing a third embodiment of the present invention.

FIG. 7 shows a third embodiment of the present invention in which the dummy wires of the present invention are arranged in the semiconductor device of the above-mentioned TQFP type package. The wires 24, which electrically connect the semiconductor chip 23 and each lead 21, extend from each electrode pad 23a, form a prescribed loop, and arrive at the ends of the leads 21. In this embodiment, one end of the dummy wires 25 are bonded near the corner of the die pad 22. The dummy wires 25 extend along the support pins 22a and are bonded at prescribed positions of the support pins 22a, that is, the positions parallel with the bonding points of the wires 24 to the leads 21. Also, as mentioned above, the die pad 22 is offset below to the leads 21, however it should be noticed that the bonding positions of the dummy wires 25 on the support pins 22a are at the same height as the leads 21. In this embodiment, the die pad 22 and the support pin 22a are made of metal. Therefore, it is not necessary to consider a special means such as an installation of stitch pads in order to bond the dummy wires 25, and silver plating, etc., can be used, if necessary.

Figure 8:
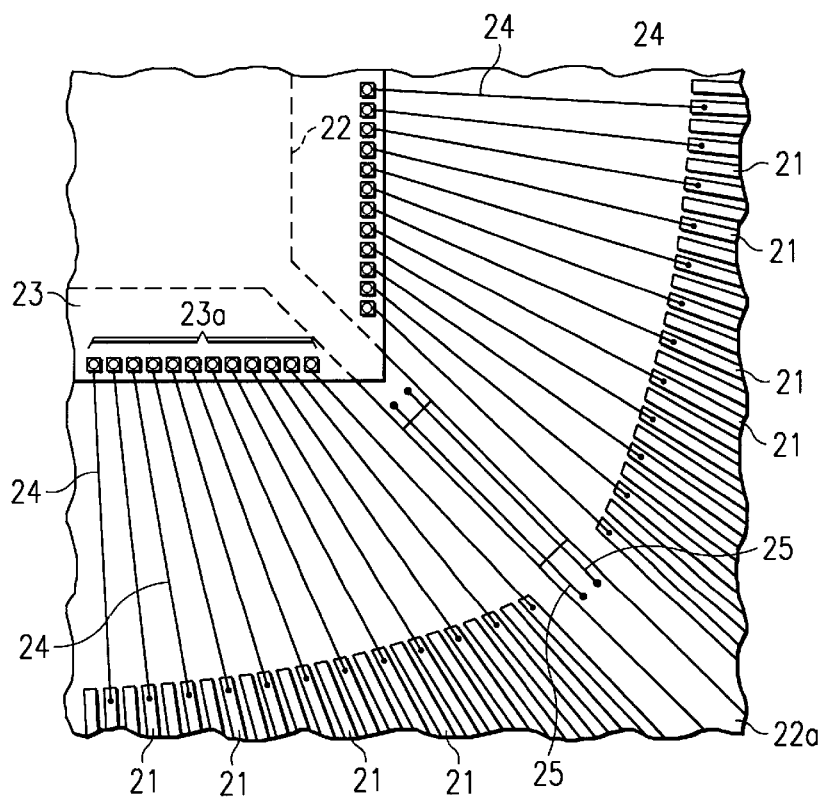
FIG. 8 is a corresponding diagram of FIG. 7 showing a fourth embodiment of the present invention.
Figure 9:
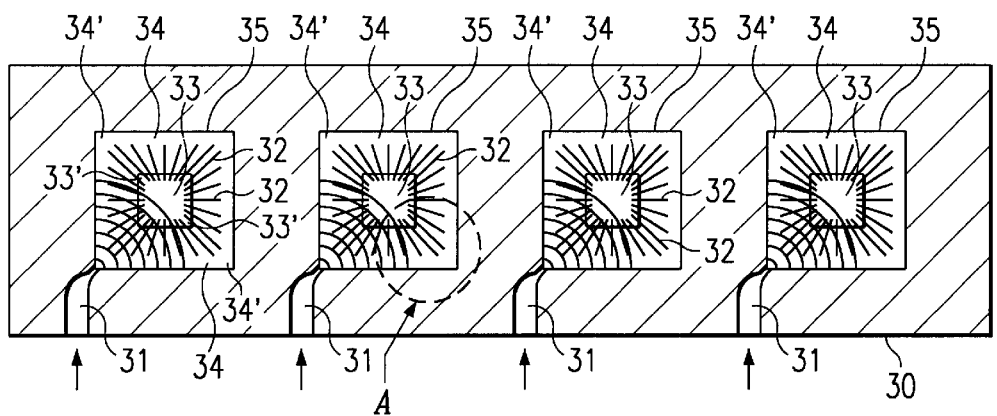
FIG. 9 is a conceptual diagram showing the flow of a resin in a mold.
Figure 10:
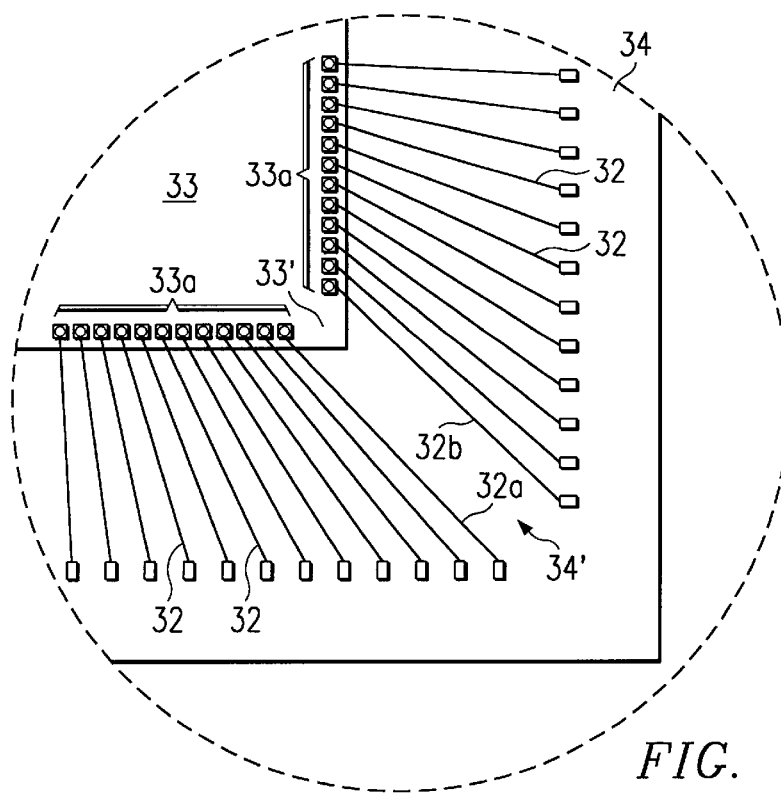
FIG. 10 is an enlarged diagram showing section A of FIG. 9 and shows a state before pouring of a molding resin in a semiconductor device with a conventional structure.

FIG. 8 shows a fourth embodiment of the present invention pertaining to the installation of the dummy wires in case the die pad is smaller than the size of the semiconductor chip. In this embodiment, the die pad 22 has a planar size that is smaller than the semiconductor chip 23 as shown by the broken line. In the TQFP type package with such a structure, both ends of the dummy wires 25 are bonded to the support pins 22a. This embodiment is the same as the embodiment of FIG. 7, including the relative position of the wires 24 and the dummy wires 25, except that the size of the die pads 22 is smaller than the size of the semiconductor chip 23.

In the BGA type package equipped with the above-mentioned two dummy wires and the BGA type package with the conventional structure, the deformation of the wires downstream of the corners of the semiconductor chip was measured. If the amount of wire deformation is $\delta_{max}$ (maximum amount deflection)/L (length of the wires)×100 [%], the amount deformed, which was 6.0% in the conventional structure, was reduced to 4.8%.

Heretofore, the embodiments of the present invention have been explained with reference to the figures. It is apparent that the application range of the present invention is not limited to the contents shown in the above-mentioned embodiments. In the embodiments, there have been dummy wires. However, since the dummy wires merely function as a resistance against the flow of the molding resin, the number is not limited. Also, it is not always necessary to shape the dummy wires and the other wires with the same looping, and the path of the looping can also be changed to increase the resistance against the flow of the molding resin. The structure of the present invention is not limited to the packages of the above-mentioned BGA type and TQFP type but can be broadly applied to any semiconductor device having a package that is equipped with wires and is sealed with molding resin.

As mentioned above, according to the present invention, when a molding resin is poured, wires in the corners of a semiconductor chip are prevented from contacting adjacent wires due to the flow of the molding resin.

In particular, in case the dummy wires are used as dam members, the contact of the above-mentioned adjacent wires can be prevented, with little change to the structure and the manufacturing processes of the semiconductor device.

What is claimed is:

1. Semiconductor device comprising a semiconductor chip that has a row of electrode pads along the periphery of the principal plane, bonding wires that extend from each electrode pad, a molding resin that covers at least the semiconductor chip and the bonding wires and that forms the external shape of the semiconductor device, and a dam member arranged between the two closest of the wires which are positioned so that the corners of the semiconductor chip are in between the wires, Wherein the dam member is composed of at least one bonding wire that is not electrically operated.

2. The semiconductor device of claim 1 wherein the dam members are located in the corners adjacent to the corner of the semiconductor chip that is closest to a pouring gate when the molding resin is poured.

3. The semiconductor device of claim 1 wherein one end of the wire, which is not electrically operated, is fixed to an electrode pad that is formed at the corner of the semiconductor chip.

4. The semiconductor device of claim 1 wherein the semiconductor chip is arranged on a die pad and that one end of the wires, which are not electrically operated, is fixed to the die pad.

5. The semiconductor device of claim 4 wherein the pad, has a die pad support pin that extends away from the pad from the corner of the semiconductor chip and that one end of each of the wires, which are not electrically operated, is fixed to the die pad support pin.

6. The semiconductor device of claim 1 wherein the second end of the wires, which are not electrically operated, is fixed near the point where the second end of the other wires is fixed.

7. The semiconductor device of claim 2 wherein the dam member is composed of at least one wire that is not electrically operated.

8. The semiconductor device of claim 3 wherein the second end of the wires, which are not electrically operated, is fixed near the point where the second end of the other wires is fixed.

9. The semiconductor device of claim 4 wherein the second end of the wires, which are not electrically operated, is fixed near the point where the second end of the other wires is fixed.

10. The semiconductor device of claim 5 wherein the second end of the wires, which are not electrically operated, is fixed near the point where the second end of the other wires is fixed.

* * * * *